United States Patent [19]

Mizukami et al.

[11] 4,256,778

[45] Mar. 17, 1981

[54] METHOD OF INSPECTING AND RETOUCHING A PHOTO MASK

[75] Inventors: Koichiro Mizukami, Kodaira; Masatoshi Migitaka, Kokubunji, both of Japan

[73] Assignee: VLSI Technology Research Association, Japan

[21] Appl. No.: 925,791

[22] Filed: Jul. 18, 1978

[30] Foreign Application Priority Data

Jul. 25, 1977 [JP] Japan ............................. 52-88427

[51] Int. Cl.³ ............................................. B05D 3/06
[52] U.S. Cl. ............................................. 427/10; 427/9; 427/35; 427/140
[58] Field of Search ............... 427/8, 9, 10, 140, 142, 427/35

[56] References Cited

U.S. PATENT DOCUMENTS

| | | | |
|---|---|---|---|
| 3,162,767 | 12/1964 | DiCurcio et al. | 250/49.5 |
| 3,748,975 | 7/1973 | Tarabocchia | 95/1 R |
| 4,109,029 | 8/1978 | Ozdemir et al. | 427/8 X |

FOREIGN PATENT DOCUMENTS 2263856  7/1973  Fed. Rep. of Germany.

OTHER PUBLICATIONS

Hawkes et al., The Preparation of Microcircuit Stencils and Patterns by Photomechanics and Electron Beam Machining, Microbionics and Reliability, vol. 4, pp. 65–79, 1965.

Bruning et al., An Automated Mask Inspection System–AMIS IEEE Trans. on Electron Devices, vol. ED-22, No. 7, Jul. 1975, pp. 487–495.

*Primary Examiner*—James R. Hoffman
*Attorney, Agent, or Firm*—Craig & Antonelli

[57] ABSTRACT

A method of treating a photo mask comprising preparing the photo mask which has a conductive transparent substance on a major surface of an insulating substrate and which is formed with a mask pattern of an opaque substance on the conductive transparent substance, and irradiating the mask with an electron beam to inspect and/or retouch said mask.

10 Claims, 8 Drawing Figures

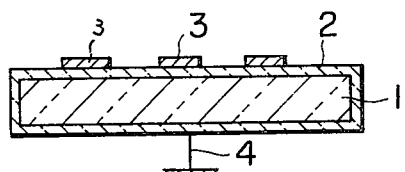
FIG. 3a
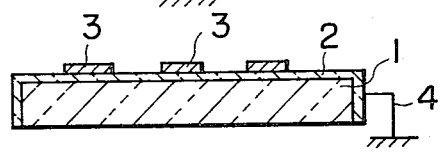
FIG. 3b
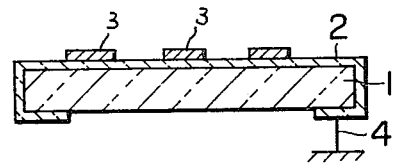
FIG. 3c
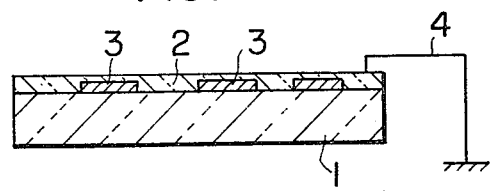
FIG. 4
FIG. 5
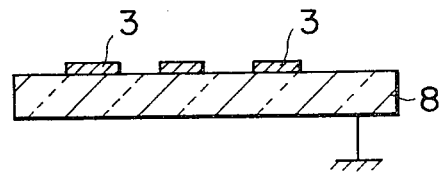

4,256,778

METHOD OF INSPECTING AND RETOUCHING A PHOTO MASK

LIST OF PRIOR ART (37 CFR 1.56(a))

The following reference is cited to show the stae of the art:
U.S. Pat. No. 3,949,131, David Bruce Fraser, issued Apr. 6, 1976, Class 428/201.

BACKGROUND OF THE INVENTION

This invention relates to a method of treatment of a photo mask such as the inspection and retouching thereof. More particularly, it relates to a method of inspecting the presence of defects in a mask pattern by irradiating the photo mask with an electron beam, and a method of retouching the defects of the mask pattern found by such an inspection. It also relates to a photo mask structure for use in the treatment.

The surface of a photo mask is irradiated with an electron beam for the purpose of inspecting the mask pattern of the photo mask. One of difficulties encountered in that case is the charge-up phenomenon of the photo mask attributed to electrons which have entered the photo mask. FIG. 1 shows the sectional structure of a photo mask which has heretofore been generally employed. Although light interceptive parts 3 and 3' are often formed of a conductive material such as chromium (Cr), a transparent glass substrate 1 itself is an insulator. Therefore, electrons having entered the light interceptive part 3 in the form of an island or an exposed glass part (transparent part) 5 cannot escape or flow. When an electron beam impinges on such a mask, the surface of the mask is charged negatively, and electrons to subsequently enter are repelled. For this reason, it is extremely difficult to precisely inspect the mask pattern.

On the other hand, in case of retouching the defects of a mask pattern in a photo mask, the defects need to be precisely examined and recognized. As understood from the above description, however, it is difficult to perform an accurate retouching for the mask pattern which is very fine.

SUMMARY OF THE INVENTION

This invention has been made as a result of the analysis of the phenomenon stated above. The invention is characterized in that, in case where a mask itself is charged as in inspecting the mask by the use of an electron beam, the mask is endowed with an electric conductivity, whereby electrons having entered are let escape to the exterior as a current. That is, according to this invention, a conductivity is bestowed on a mask, and the mask is irradiated with an electron beam under the state under which a mask pattern made of an opaque substance such as chromium (Cr) is held at a predetermined potential, thereby to prevent the charge-up of the mask at the irradiation with the electron beam and to consequently make an exact inspection and retouching of the mask pattern possible.

Hereunder, concrete embodiments of this invention will be described in detail with reference to the drawings in which:

BRIEF DESCRIPTION OF THE DRAWINGS

FIGS. 3(a) to 3(c), FIG. 4, and FIG. 5 are sectional views of the essential portions of photo masks for explaining different aspects of performance of this invention, respectively.

DESCRIPTION OF THE PREFERRED EMBODIMENTS

Figure 1:
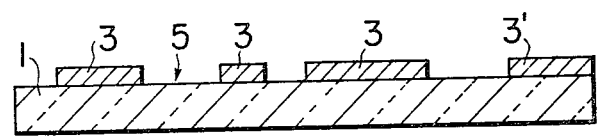
FIG. 1 is a sectional view of a prior-art photo mask.
Figure 2A:
FIGS. 2(a) and 2(b) are a sectional view of a substrate for a photo mask and a sectional view of the essential portions of the photo mask, respectively, for explaining a structure of the photo mask according to this invention and a method of inspecting a mask pattern with the structure.

FIGS. 2(a) and (b) illustrate a photo mask substrate according to this invention and an example of the sectional structure of a photo mask fabricated with the photo mask substrate, respectively. The substrate has a structure in which a transparent thin film being electrically conductive 2 is deposited on the surface of a transparent glass plate 1. A plurality of opaque substance films 3 and 3' made of chromium are disposed on the transparent thin film 2. The photo mask of such a construction is prepared, and its surface is irradiated with an electron beam 7 is order to inspect the mask pattern formed of the opaque substance films. Currents based on electrons having entered the mask surface at that time flow out through the conductive film 2. With the structure, the conductive film 2 or part of the chromium mask pattern 3 connected thereto is maintained at a predetermined potential, for example, it is grounded during the irradiation with the electron beam 7, whereby the charge-up of the mask surface is prevented without spoiling the light transmission factor of the photo mask substrate and an accurate inspection for an extraordinarily fine pattern is consequently made possible.

Figure 2B:
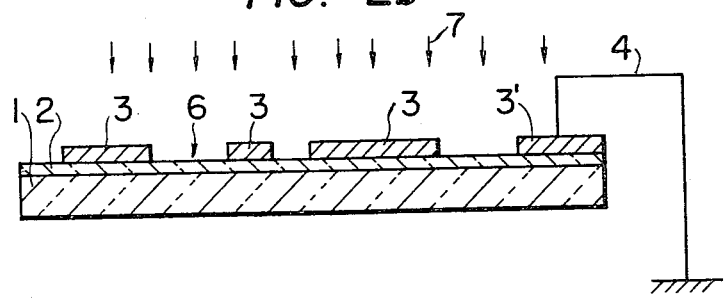

As examples of the material of the transparent conductive film 2, there are oxides of metals such as $TiO_2$, $In_2O_3$, $SnO_2$, CdO, and $CdO\text{-}SnO_2$, and Nesa glass. When the material is deposited on a glass surface into the form of a thin film by a process such as sputtering, the structure of FIG. 2 can be realized, and the prevention of the charge-up is accordingly possible. It is more favorable that the resistance of the transparent conductive film is lower. However, in order to more exactly perform the treatment of the photo mask by the electron beam irradiation, it is more desirable when taking into account the relationship between the thickness of the film, the contrast, the reflection factor etc. to have the transparent conductive film formed so as to have a sheet resistance of about 1 M $\Omega/\square$ or below.

The region in which the transparent conductive film is formed ought desirably to extend all over at least the region which is scanned by the electron beam. To the end of facilitating the electrical contact with an external part, it is convenient that a conductive film 2 is formed to cover a predetermined place besides the aforecited region as may be needed as shown by way of example in any of FIGS. 3(a) to 3(c). In FIG. 3(a), the thin film 2 made of a transparent conductive substance such as Nesa glass is disposed on all the surfaces of a glass plate 1 in a manner to continue from the front surface to the rear surface through the side surfaces thereof. Thus, the photo mask can be simply earth-connected from the rear surface which is not formed with a mask pattern 3. In FIG. 3(b), the conductive transparent film 2 is disposed in a manner to extend continuously from the upper surface to the side surfaces of a glass plate 1. In FIG. 3(c), the conductive transparent film 2 is disposed on the upper surface and side surfaces of a glass plate 1 and parts of the lower surface continuous thereto.

In the above embodiments, it has been exemplified to form the opaque mask pattern 3 on the conductive transparent thin film 2. If nesessary, it is allowed to form a mask pattern 3 directly on a glass plate 1 and to dispose a conductive transparent thin film 2 thereon as illustrated in FIG. 4. In view of the retouching of the photo mask and the utilization of the finished photo mask, however, the previous embodiments of FIG. 2 and FIG. 3 are more preferable because of a more excellent flatness which allows for a higher contrast between the reflected electrons of the electron beam when the photo mask is observed with the electron beam.

In case where defects of the mask pattern have been detected by irradiating the photo mask with the electron beam as explained above, the defects need to be corrected or retouched. In the photo masks wherein the mask pattern 3 of the opaque substance is formed on the outer surface of the transparent conductor 2 as shown in FIGS. 2(b), 3(a), 3(b) and 3(c), the partial retouching of only the mask pattern 3 can be made under the state under which the transparent conductor 2 is left as it is. The retouching of the mask pattern can be achieved by either of the following methods:

(1) A photoresist material is applied onto the mask pattern. The photoresist material is partially subjected to the spot exposure, to expose the surface of the defective part of the mask pattern. Thereafter, the defective part is etched and removed with an etchant.

(2) By irradiating the defective part of the mask pattern with a laser beam or an electron beam, the film of chromium or the like opaque substance corresponding to the defective part is volatilized away or oxidized to turn it into a transparent substance.

Especially in the mask pattern-retouching method wherein the defective part is irradiated with the electron beam, as in the inspection by the electron beam in the foregoing embodiments, the charge-up phenomenon in at least the mask surface needs to be avoided for the purpose of keeping exactly the predetermined place irradiated with the electron beam. Also to that end, it is more desirable that the mask pattern is formed on the conductive transparent substance as shown in FIGS. 2(b), 3(a), 3(b) or 3(c), that the conductive transparent substance is left as it is after the inspection of the mask, and that while maintaining the conductive transparent substance at a predetermined potential, the defective part is irradiated with the electron beam so as to retouch the mask.

Instead of using the mask substrate composed of the insulating glass plate 1 and the transparent conductor 2, a substrate 8 made of a transparent and conductive substance may be prepared as shown in FIG. 5, a mask pattern of e.g. chromium 3 being formed directly on the major surface of the substrate 8. With this measure, the reflection, absorption etc. of light at the interface between the glass and the conductive film are avoided, which is favorable in the actual use of the photo mask. Another effect attained is that the job efficiency of the retouching of the mask as previously stated is enhanced.

It is needless to say that the present invention is not restricted to the description and illustration of the embodiments, but that it is extensively applicable within a scope not departing from the spirit of the invention.

What is claimed is:

1. A method of inspecting the mask pattern of a photo mask comprising the step of preparing the photo mask in which at least part of a major surface of a transparent substrate is formed of a conductive transparent substance and in which a plurality of opaque substance films constituting a mask pattern are disposed on said conductive transparent substance, and the step of irradiating said photo mask with an electron beam under a state under which said conductive transparent substance is held at a predetermined potential.

2. A method of retouching the mask pattern of a photo mask comprising the step of preparing the photo mask which includes a transparent substrate, at least part of a major surface of said transparent substrate being formed of a conductive transparent substance, and a plurality of opaque substance films constituting a mask pattern and disposed on said conductive transparent substance, the step of inspecting any defect of said mask pattern by irradiating said photo mask with an electron beam under a state under which said conductive transparent substance is held at a predetermined potential, and the step of retouching the defect of said mask pattern.

3. The method of claim 1 wherein said conductive transparent substance is extended continuously from said major surface of said substrate on which said mask pattern is formed to the surface opposite of said major surface through the side surfaces of said substrate.

4. The method of claim 1 wherein said conductive transparent substance is extended continuously from said major surface of said substrate on which said mask pattern is formed to the side surfaces.

5. The method of claim 1 wherein said conductive transparent substance is extended continuously from said major surface of said substrate on which said mask pattern is formed to a part of the surface opposite said major surface through the side surfaces of said substrate.

6. A method of inspecting the mask pattern of a photomask comprising the step of preparing the photo mask in which a plurality of opaque substance films constituting a mask pattern are disposed on said substrate and a transparent substrate formed of a conductive transparent substance is disposed on said substrate and said plurality of opaque substance films, and the step of irradiating said photo mask with an electron beam under a state under which said conductive transparent substance is held at a predetermined potential.

7. A method of inspecting the mask pattern of a photo mask comprising the step of preparing the photo mask in which a plurality of opaque substance films constituting a mask pattern are disposed on the major surface of a substrate made up of a transparent and a conductive substance, and the step of irradiating said photo mask with an electron beam under a state under which said substrate made of a transparent and conductive substance is held at a predetermined potential.

8. A method of retouching a photo mask comprising the step of preparing the photo mask which includes a transparent substrate, at least part of a major surface of said transparent substrate, being formed of a conductive transparent substance, and a plurality of opaque substance films constituting a mask pattern and disposed on said conductive transparent substance, the step of inspecting any defect of said mask pattern by irradiating said photo mask with an electron beam under a state during which said conductive transparent substance is held at a predetermined potential, the step of applying a photoresist material onto the mask pattern, the step of partially subjecting said photoresist material to spot exposure, to expose the surface of the defective part of said mask pattern, and the step of partially retouching the defect of said mask pattern by irradiating said photo mask with an electron beam under a state during which said conductive transparent substance is held at a predetermined potential.

9. A method of retouching a photo mask comprising the step of preparing the photo mask which includes a transparent substrate, at least part of a major surface of said transparent substrate being formed of a conductive transparent substance, and a plurality of opaque substance films constituting a mask pattern and disposed on said conductive transparent substance, the step of inspecting any defect of said mask pattern by irradiating said photo mask with an electron beam under a state under which said conductive transparent substance is held at a predetermined potential, and the step of retouching the defect of said mask pattern.

10. A method of treating the mask pattern of a photo mask comprising the steps of:
 (a) irradiating said photomask which has a transparent substance in at least part of a major surface of said transparent substance with an electron beam while said conductive transparent substance is held at a predetermined potential;
 (b) scanning said electron beam across at least part of a major surface of said photo mask.

* * * * *